United States Patent
Lee et al.

(10) Patent No.: US 8,710,668 B2
(45) Date of Patent: Apr. 29, 2014

(54) INTEGRATED CIRCUIT PACKAGING SYSTEM WITH LASER HOLE AND METHOD OF MANUFACTURE THEREOF

(75) Inventors: HyungMin Lee, Bucheon-si (KR); HeeJo Chi, Ichon-si (KR); YeongIm Park, Yongin (KR)

(73) Assignee: Stats ChipPac Ltd., Singapore (SG)

( * ) Notice: Subject to any disclaimer, the term of this patent is extended or adjusted under 35 U.S.C. 154(b) by 313 days.

(21) Appl. No.: 13/163,150

(22) Filed: Jun. 17, 2011

(65) Prior Publication Data
US 2012/0319294 A1 Dec. 20, 2012

(51) Int. Cl.
*H01L 23/12* (2006.01)

(52) U.S. Cl.
USPC ............ 257/774; 257/E21.502; 257/E23.011; 438/124

(58) Field of Classification Search
CPC ............................ H01L 23/3135; H01L 23/315

USPC .................. 257/686, 774, E21.502, E23.011; 438/124

See application file for complete search history.

(56) References Cited

U.S. PATENT DOCUMENTS

| 7,608,921 B2 | 10/2009 | Pendse |
| 7,863,735 B1 | 1/2011 | Cho et al. |
| 7,863,755 B2 | 1/2011 | Lee et al. |
| 2007/0235215 A1 | 10/2007 | Bathan et al. |
| 2009/0243065 A1* | 10/2009 | Sugino et al. ................. 257/686 |

OTHER PUBLICATIONS

U.S. Appl. No. 12/796,668, filed Jun. 8, 2010, Ko.

\* cited by examiner

*Primary Examiner* — Eva Yan Montalvo
(74) *Attorney, Agent, or Firm* — Ishimaru & Associates LLP

(57) ABSTRACT

A method of manufacture of an integrated circuit packaging system includes: providing a substrate; molding a first encapsulation above the substrate; forming a via through the first encapsulation; mounting an integrated circuit above the substrate and between sides of the first encapsulation; and forming a second encapsulation covering the integrated circuit and the first encapsulation.

18 Claims, 8 Drawing Sheets

US 8,710,668 B2

INTEGRATED CIRCUIT PACKAGING SYSTEM WITH LASER HOLE AND METHOD OF MANUFACTURE THEREOF

TECHNICAL FIELD

The present invention relates generally to an integrated circuit packaging system and more particularly to a system for utilizing a hole with an integrated circuit packaging system.

BACKGROUND

The rapidly growing market for portable electronic devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a substrate; molding a first encapsulation above the substrate; forming a via through the first encapsulation; mounting an integrated circuit above the substrate and between sides of the first encapsulation; and forming a second encapsulation covering the integrated circuit and the first encapsulation.

The present invention provides an integrated circuit packaging system, including: a substrate; a first encapsulation molded above the substrate; a via formed through the first encapsulation; an integrated circuit mounted above the substrate and between sides of the first encapsulation; a second encapsulation encapsulating covering the integrated circuit and the first encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
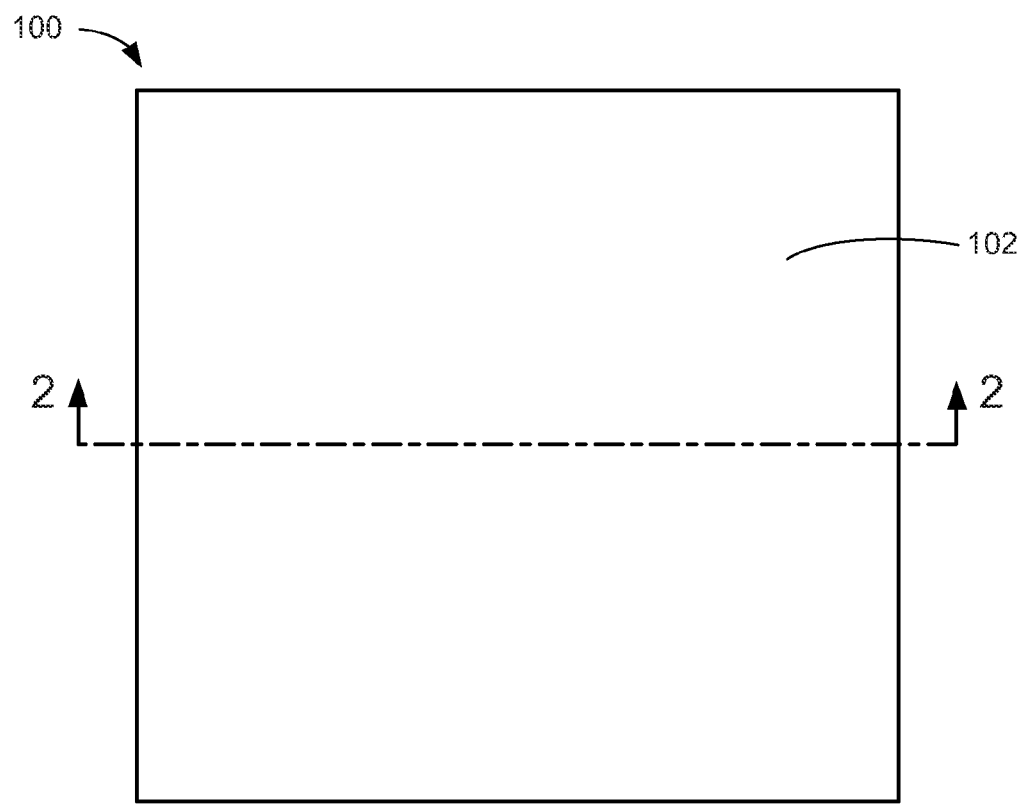
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an external package 102. As an exemplary illustration, the integrated circuit package system 100 can generally be used within a portable electronics device that requires a high level of functional integration, such as a cellphone or computer.

Figure 2:
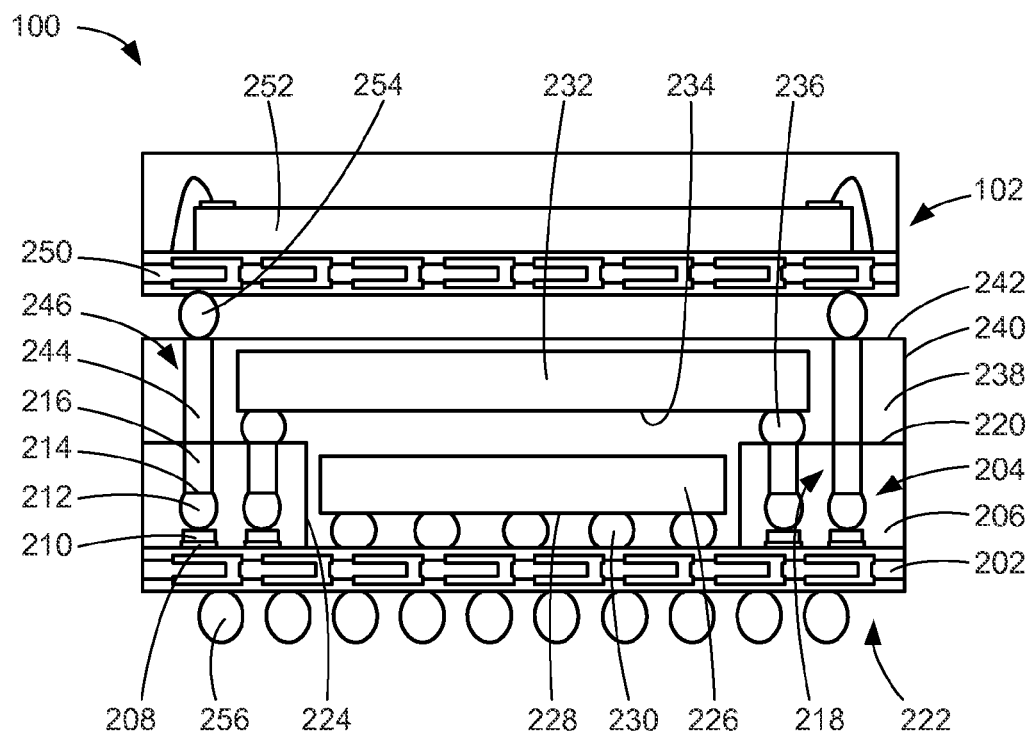
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202. The substrate 202 is defined as a physical material on which an integrated circuit package is formed having internal conduction and isolation for signals. The substrate 202 can be laminated plastic, ceramic, or glass.

First vias 204 are formed above the substrate 202 and are encapsulated with a first encapsulation 206. The first encapsulation 206 is defined as a structure that protects sensitive components from moisture, dust and other contamination. The first encapsulation 206 can be glob top, film assist molding, or other encasement structures.

The first vias 204 are defined as conductive structures formed through the first encapsulation 206 and are depicted as having pillars 208 over the substrate 202 and in direct contact with the substrate 202. The pillars 208 are defined as an electrically conductive structure that acts to support other structures of the first vias 204. The pillars 208 can be copper, aluminum, gold, or other conductive materials.

A paste 210 is formed above the pillars 208. The paste 210 is defined as an electrically conductive material that forms a robust electrical and mechanical connection with the pillars 208. The paste 210 makes a robust connection with the pillars 208 and with spheroids 212 affixed above the paste 210. The spheroids 212 can be an embedded solder balls, an electrical polymer, or other conductive materials capable of robust connection with the paste 210. The spheroids 212 are shown having a spherical shape with flat tops 214. The spheroids 212 are attached in the paste 210 with a spherical portion of the spheroids 212 attached in the paste 210.

Vertical conductors 216 are formed above the flat tops 214. The vertical conductors 216 are defined as a conductive material that can fill a hole or depression, conduct electricity, conform to a surface of a depression or hole, and can form an electrical and mechanical connection. The vertical conductors 216 are depicted filling first holes 218 in the first encapsulation 206. The first holes 218 can be laser cut, wet etched, or dry etched and can have irregular side surfaces. The vertical conductors 216 can have the physical characteristics of conforming to the irregular side surfaces and form a robust mechanical connection to the first encapsulation 206. The first vias 204 are represented traversing the first encapsulation 206 from the substrate 202 and exposed from the first encapsulation 206.

The vertical conductors 216 of the first vias 204 are depicted as coplanar with a planar surface 220 of the first encapsulation 206. The planar surface 220 can extend laterally over an entire top surface of the first encapsulation 206 and provide a stable mounting surface or connection point. The first encapsulation 206 is formed along a perimeter region 222 of the substrate 202. The first vias 204 are formed within the first encapsulation 206 along the perimeter region 222 of the substrate 202. The first encapsulation 206 is depicted having sides 224 facing each other. The sides 224 are defined as sides 224 that extend vertically above the substrate 202 and can be vertical sides, irregular shaped vertical sides, or slanted sides and are specifically depicted as flat vertical sides.

It has been discovered that the first encapsulation 206 when utilized in combination with the substrate 202 of the present invention provides package stacking solutions for small size logic integrated circuits with high pin count and large size memory integrated circuits with low pin count within the same package. It has further been discovered that utilizing the first vias 204 in combination with the first encapsulation 206 provides stacking solutions that are mechanically rigid, and low profile when used with an integrated circuit between the sides 224 of the first encapsulation 206.

A first integrated circuit 226 is mounted between the sides 224 having a first active surface 228 facing the substrate 202 and connected thereto with first interconnects 230. The first integrated circuit 226 is defined as an active component having transistor elements such as a wire-bonded die or a flip-chip die and is specifically depicted as a flip-chip integrated circuit. Active circuitry contained on the first active side 228 is defined as including transistor elements. The first interconnects 230 are defined as conductive structures for routing signals between elements and can be bond wires, solder balls, conductive polymers, vertical via structures and are depicted specifically as solder balls. The first integrated circuit 226 is depicted between the sides 224 and below the planar surface 220 of the first encapsulation 206.

A second integrated circuit 232 is mounted above the first integrated circuit 226. The second integrated circuit 232 is defined as an active component having transistor elements such as a wire-bonded die or a flip-chip die and is specifically depicted as a flip-chip integrated circuit with a second active side 234 facing toward from the first integrated circuit 226 and the substrate 202. The second active side 234 is connected and is attached to the first vias 204 with second interconnects 236. The second interconnects 236 are defined as conductive structures for routing signals between elements and can be bond wires, solder balls, conductive polymers, vertical via structures and are depicted specifically as solder balls. The second integrated circuit 232 is depicted above the sides 224 of the first encapsulation 206. The second integrated circuit 232 is further depicted as above the planar surface 220 of the first encapsulation 206. The second integrated circuit 232 can be mounted above the first integrated circuit 226 with a space therebetween.

A second encapsulation 238 is formed above the first encapsulation 206. The second encapsulation 238 encapsulates the first integrated circuit 226, the first interconnects 230, the second integrated circuit 232, the second interconnects 236, and the sides 224 and the planar surface 220 of the first encapsulation 206. The second encapsulation 238 is portrayed having an exterior surface 240 that is coplanar with the first encapsulation 206 and coplanar with the substrate 202. The second encapsulation 238 is further portrayed having a top surface 242 that is flat.

Second vias 244 traverse from the planar surface 220 of the first encapsulation 206 to the top surface 242 of the second encapsulation 238. The second vias 244 are exposed from the second encapsulation 238 and are coplanar with the top surface 242. The second vias 244 are depicted as vertical conductors filling second holes 246 in the second encapsulation 238. The second holes 246 can be laser cut, wet etched, or dry etched and can have irregular side surfaces. The second vias 244 can have the physical characteristics of conforming to the irregular side surfaces forming a robust mechanical connection to the second encapsulation 238 and also forming a robust mechanical and electrical connection to the vertical conductors 216 of the first vias 204.

It has been discovered that the first vias 216 and the second vias 244 of the present invention can provide a very fine pitch for greater density interconnections. It has been further discovered that the first vias 216 and the second vias 244 of the present invention provide increased reliability, accuracy, and density of interconnections.

The external package 102 is mounted above the top surface 242 of the second encapsulation 238. The external package 102 having an external substrate 250 and an external integrated circuit 252 electrically connected to the second vias 244 with external package interconnects 254. Below the substrate 202 external interconnects 256 are mounted.

Figure 3:
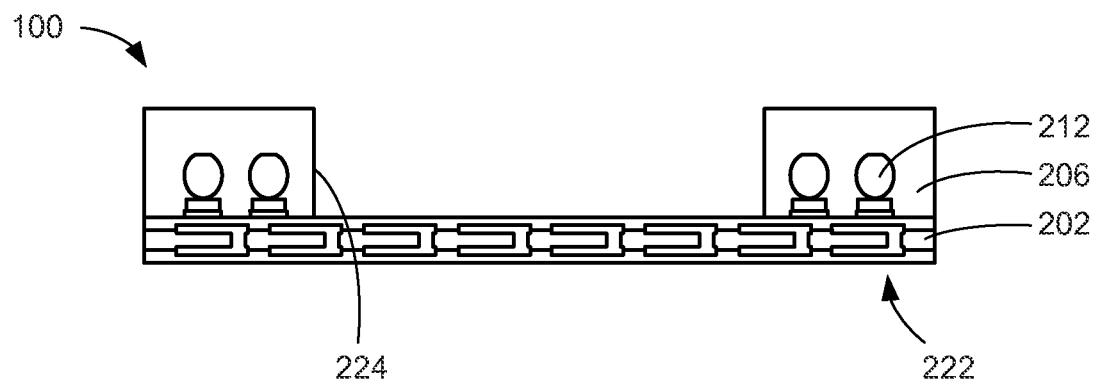
FIG. 3 is the integrated circuit packaging system of FIG. 2 after a first encapsulation phase of manufacture.

Referring now to FIG. 3, therein is shown the integrated circuit packaging system 100 of FIG. 2 after a first encapsulation phase of manufacture. The integrated circuit packaging system 100 is shown having the first encapsulation 206 encasing the spheroids 212 over the substrate 202. The first encapsulation 206 is shown having the sides 224 facing each other and formed along the perimeter region 222 of the substrate 202.

Figure 4:
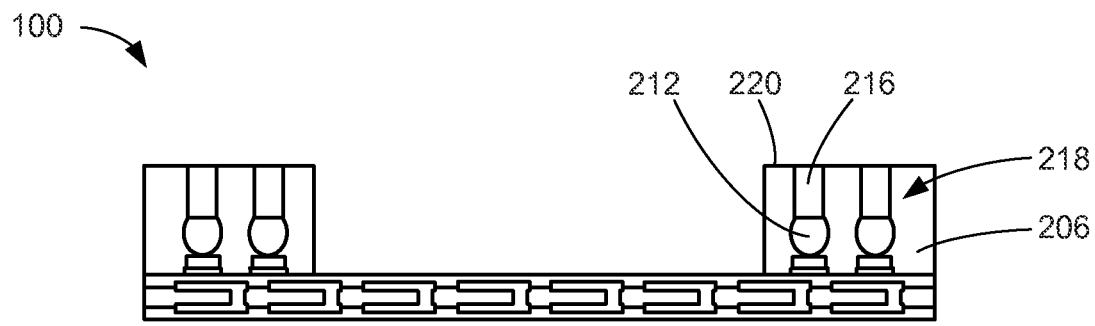
FIG. 4 is the integrated circuit packaging system of FIG. 3 after a first fill phase of manufacture.

Referring now to FIG. 4, therein is shown the integrated circuit packaging system 100 of FIG. 3 after a first fill phase of manufacture. The integrated circuit packaging system 100 is shown having the first holes 218 formed through the first encapsulation 206 from the spheroids 212 to the planar surface 220 of the first encapsulation 206. The first holes 218 are further shown filled with the vertical conductors 216 and coplanar to the planar surface 220 of the first encapsulation 206.

Figure 5:
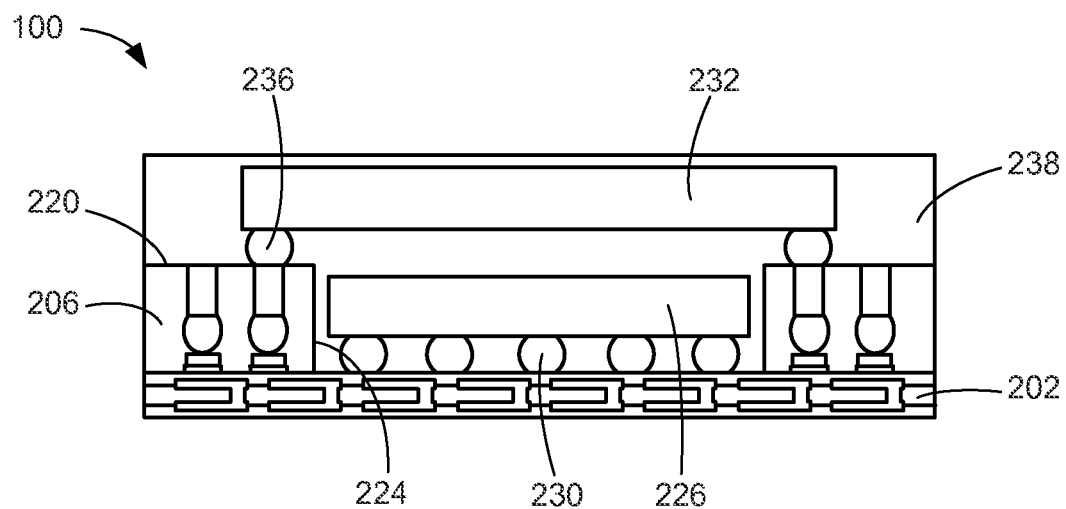
FIG. 5 is the integrated circuit packaging system of FIG. 4 after a second encapsulation phase of manufacture.

Referring now to FIG. 5, therein is shown the integrated circuit packaging system 100 of FIG. 4 after a second encapsulation phase of manufacture. The integrated circuit packaging system 100 is shown having the first integrated circuit 226 and the second integrated circuit 232 mounted over the substrate 202. The second encapsulation 238 is depicted formed encapsulating the first integrated circuit 226, the first interconnects 230, the second integrated circuit 232, the second interconnects 236, and the sides 224 and the planar surface 220 of the first encapsulation 206.

Figure 6:
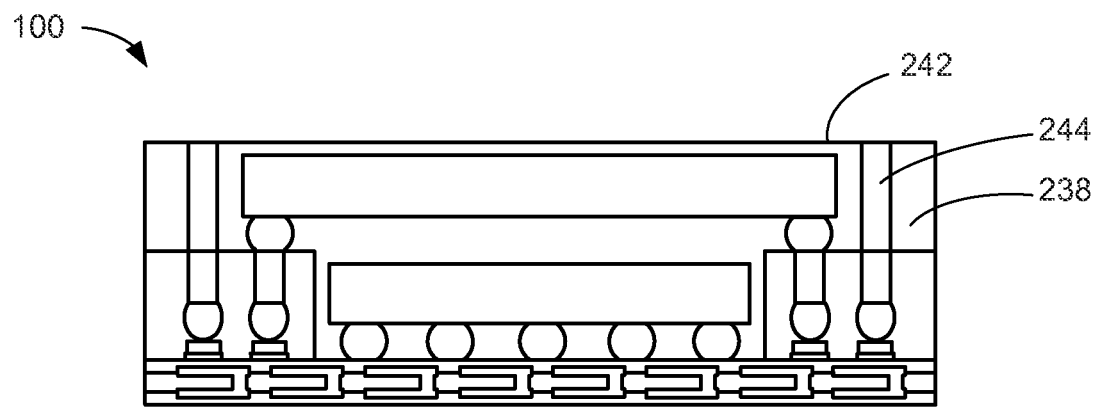
FIG. 6 is the integrated circuit packaging system of FIG. 5 after a second fill phase of manufacture.

Referring now to FIG. 6, therein is shown the integrated circuit packaging system 100 of FIG. 5 after a second fill phase of manufacture. The integrated circuit packaging system 100 is shown having the second vias 244 formed through the second encapsulation 238 and exposed from the top surface 242 of the second encapsulation 238.

Figure 7:
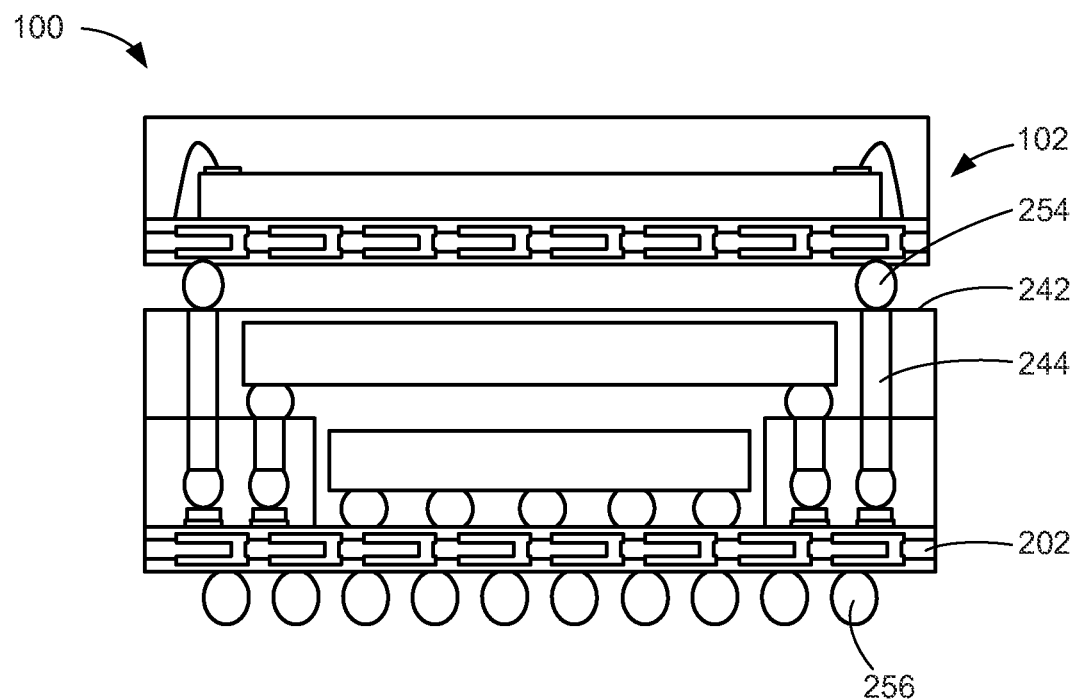
FIG. 7 is the integrated circuit packaging system of FIG. 6 after an external package mounting phase of manufacture.

Referring now to FIG. 7, therein is shown the integrated circuit packaging system 100 of FIG. 6 after an external package mounting phase of manufacture. The integrated circuit packaging system 100 is shown having the external package 102 mounted above the top surface 242 and electrically connected to the second vias 244 with the external package interconnects 254. The external interconnects 256 are further shown mounted below the substrate 202.

Figure 8:
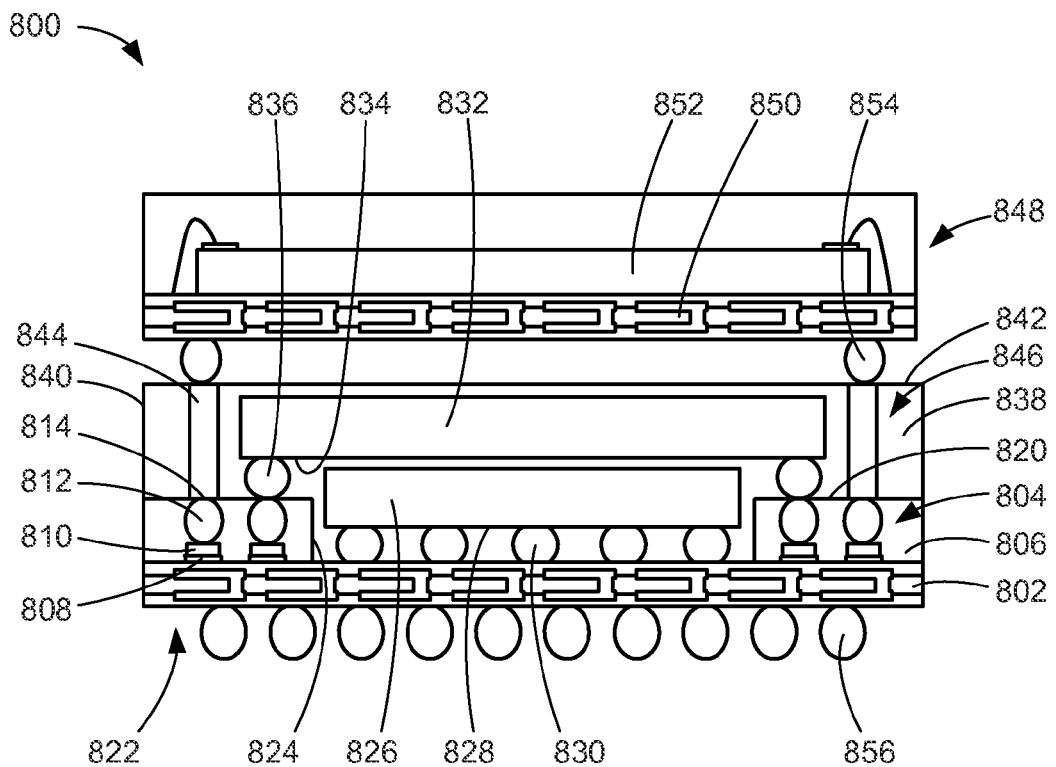
FIG. 8 is a cross-sectional view of an integrated circuit packaging system in a second embodiment of the present invention.

Referring now to FIG. 8, therein is shown a cross-sectional view of an integrated circuit packaging system 800 in a second embodiment of the present invention. The integrated circuit packaging system 800 is shown having a substrate 802. The substrate 802 is defined as a physical material on which an integrated circuit package is formed having internal conduction and isolation for signals. The substrate 802 can be laminated plastic, ceramic, or glass.

First vias 804 are formed above the substrate 802 and are encapsulated with a first encapsulation 806. The first encapsulation 806 is defined as a structure that protects sensitive components from moisture, dust and other contamination. The first encapsulation 806 can be glob top, film assist molding, or other encasement structures.

The first vias 804 are defined as conductive structures formed through the first encapsulation 806 and are depicted as having pillars 808 over the substrate 802 and in direct contact with the substrate 802. The pillars 808 are defined as an electrically conductive structure that acts to support other structures of the first vias 804. The pillars 808 can be copper, aluminum, gold, or other conductive materials.

A paste 810 is formed above the pillars 808. The paste 810 is defined as an electrically conductive material that forms a robust electrical and mechanical connection with the pillars 808. The paste 810 makes a robust connection with the pillars 808 and with spheroids 812 affixed above the paste 810. The spheroids 812 can be an embedded solder balls, an electrical polymer, or other conductive materials capable of robust connection with the paste 810. The spheroids 812 are shown having a spherical shape with flat tops 814. The spheroids 812 are attached in the paste 810 with a spherical portion of the spheroids 812 attached in the paste 810. The first vias 804 are represented traversing the first encapsulation 806 from the substrate 802 and exposed from the first encapsulation 806.

The flat tops 814 of the spheroids 812 of the first vias 804 are depicted as coplanar with a planar surface 820 of the first encapsulation 806. The planar surface 820 can extend laterally over an entire top surface of the first encapsulation 806 and provide a stable mounting surface or connection point. The first encapsulation 806 is formed along a perimeter region 822 of the substrate 802. The first vias 804 are formed within the first encapsulation 806 along the perimeter region 822 of the substrate 802. The first encapsulation 806 is depicted having sides 824 facing each other. The sides 824 are defined as sides 824 that extend vertically above the substrate 802 and can be vertical sides, irregular shaped vertical sides, or slanted sides and are specifically depicted as flat vertical sides.

It has been discovered that the first encapsulation 806 when utilized in combination with the substrate 802 of the present invention provides package stacking solutions for small size logic integrated circuits with high pin count and large size memory integrated circuits with low pin count within the same package. It has further been discovered that utilizing the first vias 804 in combination with the first encapsulation 806 provides stacking solutions that are mechanically rigid, and low profile when used with an integrated circuit between the sides 824 of the first encapsulation 806.

A first integrated circuit 826 is mounted between the sides 824 having a first active surface 828 facing the substrate 802 and connected thereto with first interconnects 830. The first integrated circuit 826 is defined as an active component having transistor elements such as a wire-bonded die or a flip-chip die and is specifically depicted as a flip-chip integrated circuit. Active circuitry contained on the first active side 828 is defined as including transistor elements. The first interconnects 830 are defined as conductive structures for routing signals between elements and can be bond wires, solder balls, conductive polymers, vertical via structures and are depicted specifically as solder balls. The first integrated circuit 826 is depicted between the sides 824 and partially below the planar surface 820 and partially above the planar surface 820 of the first encapsulation 806.

A second integrated circuit 832 is mounted above the first integrated circuit 826. The second integrated circuit 832 is defined as an active component having transistor elements such as a wire-bonded die or a flip-chip die and is specifically depicted as a flip-chip integrated circuit with a second active side 834 facing toward from the first integrated circuit 826 and the substrate 802. The second active side 834 is connected and is attached to the first vias 804 with second interconnects 836. The second interconnects 836 are defined as conductive structures for routing signals between elements and can be bond wires, solder balls, conductive polymers, vertical via structures and are depicted specifically as solder balls. The second integrated circuit 832 is depicted above the sides 824 of the first encapsulation 806. The second integrated circuit 832 is further depicted as above the planar surface 820 of the first encapsulation 806. The second integrated circuit 832 can be mounted over the first integrated circuit 826 with a space therebetween.

A second encapsulation 838 is formed above the first encapsulation 806. The second encapsulation 838 encapsulates the first integrated circuit 826, the first interconnects 830, the second integrated circuit 832, the second interconnects 836, and the sides 824 and the planar surface 820 of the first encapsulation 806. The second encapsulation 838 is portrayed having an exterior surface 840 that is coplanar with the first encapsulation 806 and coplanar with the substrate 802. The second encapsulation 838 is further portrayed having a top surface 842 that is flat.

Second vias 844 traverse from the planar surface 820 of the first encapsulation 806 to the top surface 842 of the second encapsulation 838. The second vias 844 are exposed from the second encapsulation 838 and are coplanar with the top surface 842. The second vias 844 are depicted as vertical conductors filling holes 846 in the second encapsulation 838. The holes 846 can be laser cut, wet etched, or dry etched and can have irregular side surfaces. The second vias 844 can have the physical characteristics of conforming to the irregular side surfaces forming a robust mechanical connection to the second encapsulation 838 and also forming a robust mechanical and electrical connection to the spheroids 812 of the first vias 804.

It has been discovered that the second vias 844 of the present invention can provide a very fine pitch for greater density interconnections. It has been further discovered that the second vias 844 of the present invention provide increased reliability, accuracy, and density of interconnections.

An external package 848 is mounted above the top surface 842 of the second encapsulation 838. The external package 848 having an external substrate 850 and an external integrated circuit 852 electrically connected to the second vias 844 with external package interconnects 854. Below the substrate 802 external interconnects 856 are mounted.

Figure 9:
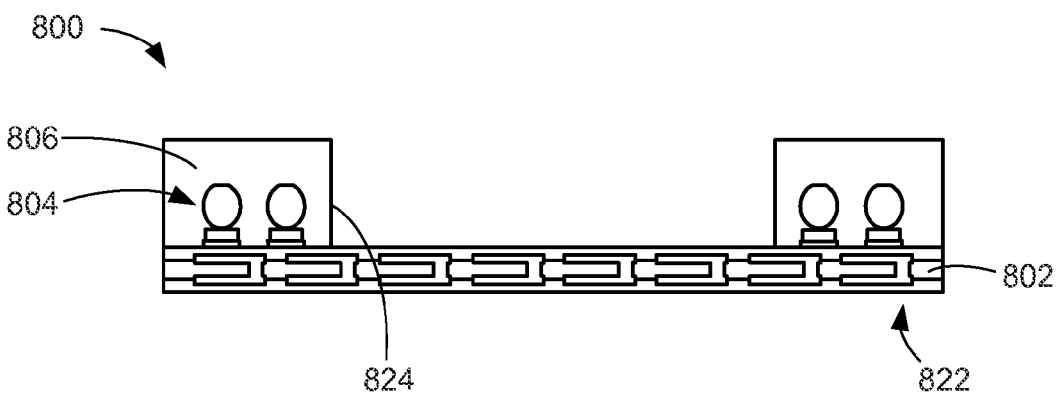
FIG. 9 is the integrated circuit packaging system of FIG. 8 after a first encapsulation phase of manufacture.

Referring now to FIG. 9, therein is shown the integrated circuit packaging system 800 of FIG. 8 after a first encapsulation phase of manufacture. The integrated circuit packaging system 800 is shown having the first encapsulation 806 encasing the first vias 804 over the substrate 802. The first encapsulation 806 does not expose the first via 804 at this process step. The first encapsulation 806 is shown having the sides 824 facing each other and formed along the perimeter region 822 of the substrate 802.

Figure 10:
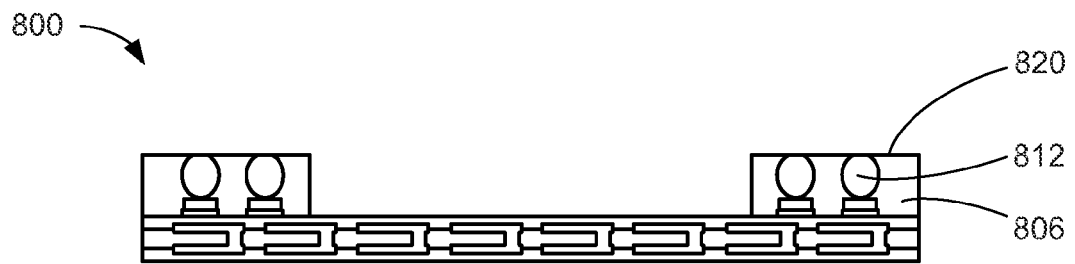
FIG. 10 is the integrated circuit packaging system of FIG. 9 after a leveling phase of manufacture.

Referring now to FIG. 10, therein is shown the integrated circuit packaging system 800 of FIG. 9 after a leveling phase of manufacture. The integrated circuit packaging system 800 is shown having the planar surface 820 created in the first encapsulation 806 exposing the spheroids 812 therefrom. The planar surface 820 has been formed by removing portions of the first encapsulation 806 and can be formed by grinding or etching.

Figure 11:
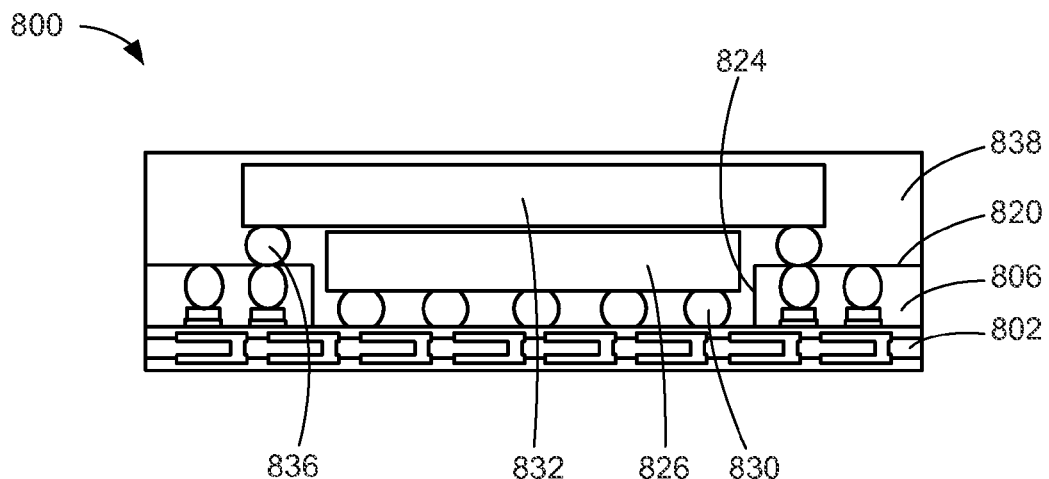
FIG. 11 is the integrated circuit packaging system of FIG. 10 after a second encapsulation phase of manufacture.

Referring now to FIG. 11, therein is shown the integrated circuit packaging system 800 of FIG. 10 after a second encapsulation phase of manufacture. The integrated circuit packaging system 800 is shown having the first integrated circuit 826 and the second integrated circuit 832 mounted over the substrate 802. The second encapsulation 838 is depicted formed encapsulating the first integrated circuit 826, the first interconnects 830, the second integrated circuit 832, the second interconnects 836, and the sides 824 and the planar surface 820 of the first encapsulation 806.

Figure 12:
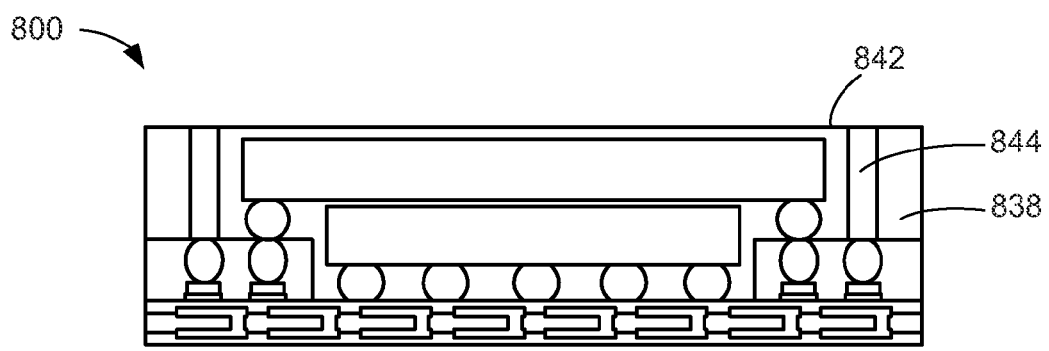
FIG. 12 is the integrated circuit packaging system of FIG. 11 after a fill phase of manufacture.

Referring now to FIG. 12, therein is shown the integrated circuit packaging system 800 of FIG. 11 after a fill phase of manufacture. The integrated circuit packaging system 800 is shown having the second vias 844 formed through the second encapsulation 838 and exposed from the top surface 842 of the second encapsulation 838.

Figure 13:
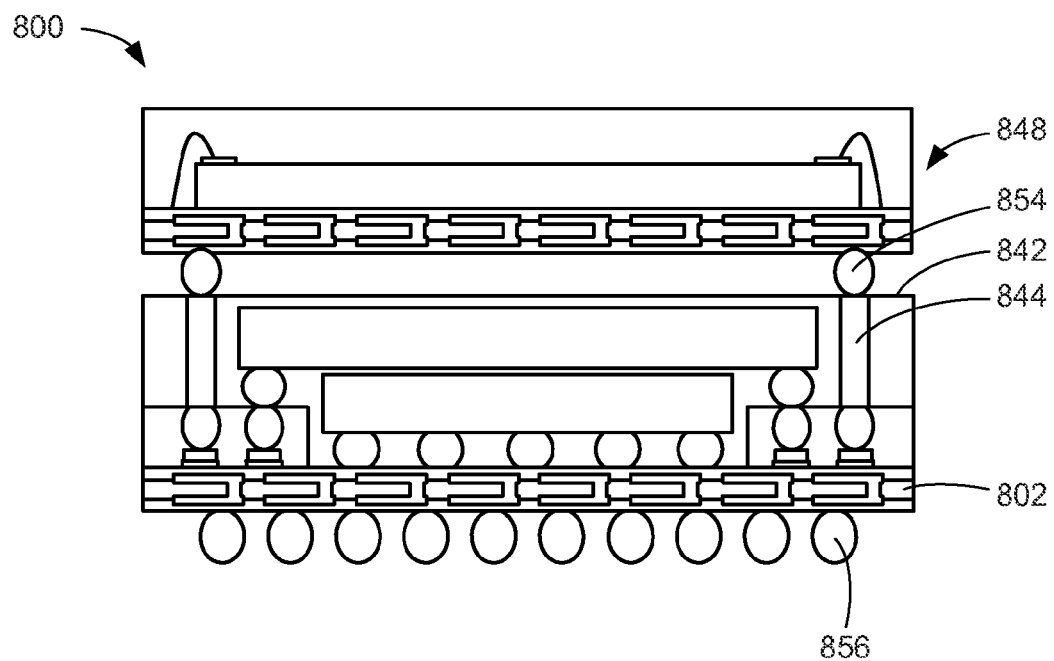
FIG. 13 is the integrated circuit packaging system of FIG. 12 after an external package mounting phase of manufacture.

Referring now to FIG. 13, therein is shown the integrated circuit packaging system 800 of FIG. 12 after an external package mounting phase of manufacture. The integrated circuit packaging system 800 is shown having the external package 848 mounted above the top surface 842 and electrically connected to the second vias 844 with the external package interconnects 854. The external interconnects 856 are further shown mounted below the substrate 802.

Figure 14:
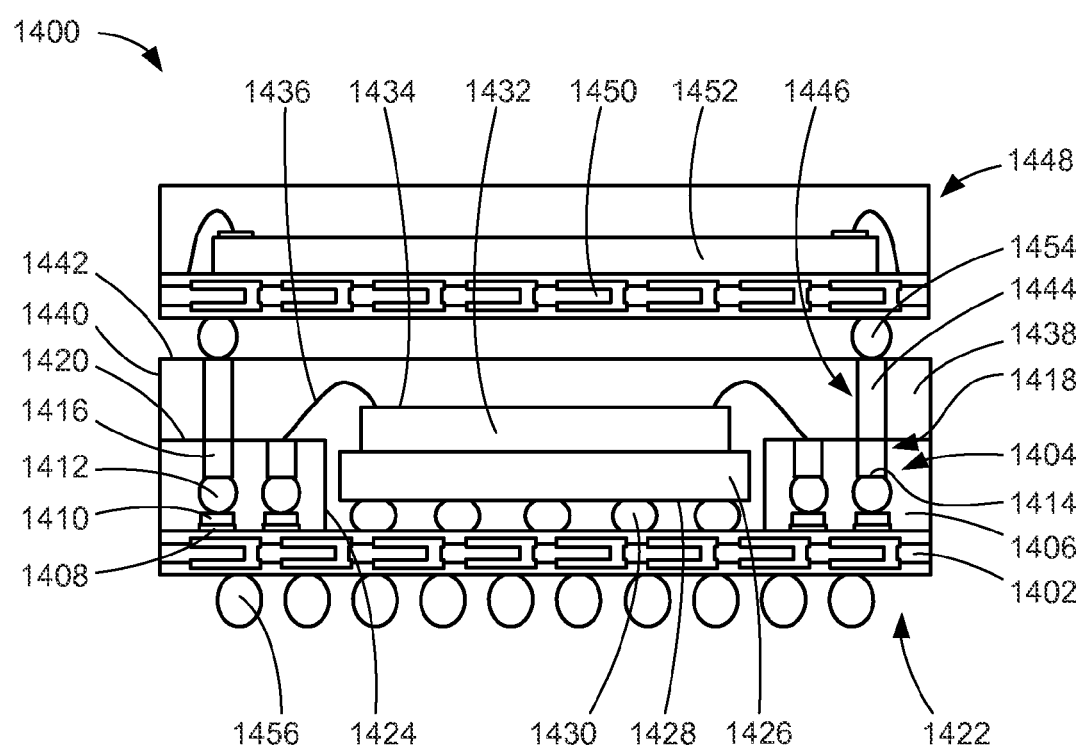
FIG. 14 is a cross-sectional view of an integrated circuit packaging system in a third embodiment of the present invention.

Referring now to FIG. 14, therein is shown a cross-sectional view of an integrated circuit packaging system 1400 in a third embodiment of the present invention. The integrated circuit packaging system 1400 is shown having a substrate 1402. The substrate 1402 is defined as a physical material on which an integrated circuit package is formed having internal conduction and isolation for signals. The substrate 1402 can be laminated plastic, ceramic, or glass.

First vias 1404 are formed above the substrate 1402 and are encapsulated with a first encapsulation 1406. The first encapsulation 1406 is defined as a structure that protects sensitive components from moisture, dust and other contamination. The first encapsulation 1406 can be glob top, film assist molding, or other encasement structures.

The first vias 1404 are defined as conductive structures formed through the first encapsulation 1406 and are depicted as having pillars 1408 over the substrate 1402 and in direct contact with the substrate 1402. The pillars 1408 are defined as an electrically conductive structure that acts to support other structures of the first vias 1404. The pillars 1408 can be copper, aluminum, gold, or other conductive materials.

A paste 1410 is formed above the pillars 1408. The paste 1410 is defined as an electrically conductive material that forms a robust electrical and mechanical connection with the pillars 1408. The paste 1410 makes a robust connection with the pillars 1408 and with spheroids 1412 affixed above the paste 1410. The spheroids 1412 can be an embedded solder balls, an electrical polymer, or other conductive materials capable of robust connection with the paste 1410. The spheroids 1412 are shown having a spherical shape with flat tops 1414. The spheroids 1412 are attached in the paste 1410 with a spherical portion of the spheroids 1412 attached in the paste 1410.

Vertical conductors 1416 are formed above the flat tops 1414. The vertical conductors 1416 are defined as a conductive material that can fill a hole or depression, conduct electricity, conform to a surface of a depression or hole, and can form an electrical and mechanical connection. The vertical conductors 1416 are depicted filling first holes 1418 in the first encapsulation 1406. The first holes 1418 can be laser cut, wet etched, or dry etched and can have irregular side surfaces. The vertical conductors 1416 can have the physical characteristics of conforming to the irregular side surfaces and form a robust mechanical connection to the first encapsulation 1406. The first vias 1404 are represented traversing the first encapsulation 1406 from the substrate 1402 and exposed from the first encapsulation 1406.

The vertical conductors 1416 of the first vias 1404 are depicted as coplanar with a planar surface 1420 of the first encapsulation 1406. The planar surface 1420 can extend laterally over an entire top surface of the first encapsulation 1406 and provide a stable mounting surface or connection point. The first encapsulation 1406 is formed along a perimeter region 1422 of the substrate 1402. The first vias 1404 are formed within the first encapsulation 1406 along the perimeter region 1422 of the substrate 1402. The first encapsulation 1406 is depicted having sides 1424 facing each other. The sides 1424 are defined as sides 1424 that extend vertically above the substrate 1402 and can be vertical sides, irregular shaped vertical sides, or slanted sides and are specifically depicted as flat vertical sides.

It has been discovered that the first encapsulation 1406 when utilized in combination with the substrate 1402 of the present invention provides package stacking solutions for small size logic integrated circuits with high pin count and large size memory integrated circuits with low pin count within the same package. It has further been discovered that utilizing the first vias 1404 in combination with the first encapsulation 1406 provides stacking solutions that are mechanically rigid, and low profile when used with an integrated circuit between the sides 1424 of the first encapsulation 1406.

A first integrated circuit 1426 is mounted between the sides 1424 having a first active surface 1428 facing the substrate 1402 and connected thereto with first interconnects 1430. The first integrated circuit 1426 is defined as an active component having transistor elements such as a wire-bonded die or a flip-chip die and is specifically depicted as a flip-chip integrated circuit. Active circuitry contained on the first active side 1428 is defined as including transistor elements. The first interconnects 1430 are defined as conductive structures for routing signals between elements and can be bond wires, solder balls, conductive polymers, vertical via structures and are depicted specifically as solder balls. The first integrated circuit 1426 is depicted between the sides 1424 and below the planar surface 1420 of the first encapsulation 1406.

A second integrated circuit 1432 is mounted above the first integrated circuit 1426. The second integrated circuit 1432 can be a wire-bonded integrated circuit with a second active side 1434 facing away from the first integrated circuit 1426 and the substrate 1402. The second active side 1434 is connected and is attached to the first vias 1404 with second interconnects 1436. The second interconnects 1436 can be bond wires. The second integrated circuit 1432 is depicted between the sides 1424 of the first encapsulation 1406. The second integrated circuit 1432 is further depicted as partially above the planar surface 1420 and partially below the planar surface 1420 of the first encapsulation 1406. The second integrated circuit 1432 can be mounted in direct contact to the first integrated circuit 1426 without a space therebetween.

A second encapsulation 1438 is formed above the first encapsulation 1406. The second encapsulation 1438 encapsulates the first integrated circuit 1426, the first interconnects 1430, the second integrated circuit 1432, the second interconnects 1436, and the sides 1424 and the planar surface 1420 of the first encapsulation 1406. The second encapsulation 1438 is portrayed having an exterior surface 1440 that is coplanar with the first encapsulation 1406 and coplanar with the substrate 1402. The second encapsulation 1438 is further portrayed having a top surface 1442 that is flat.

Second vias 1444 traverse from the planar surface 1420 of the first encapsulation 1406 to the top surface 1442 of the second encapsulation 1438. The second vias 1444 are exposed from the second encapsulation 1438 and are coplanar with the top surface 1442. The second vias 1444 are depicted as vertical conductors filling second holes 1446 in the second encapsulation 1438. The second holes 1446 can be laser cut, wet etched, or dry etched and can have irregular side surfaces. The second vias 1444 can have the physical characteristics of conforming to the irregular side surfaces forming a robust mechanical connection to the second encapsulation 1438 and also forming a robust mechanical and electrical connection to the vertical conductors 1416 of the first vias 1404.

It has been discovered that the first vias 1416 and the second vias 1444 of the present invention can provide a very fine pitch for greater density interconnections. It has been further discovered that the first vias 1416 and the second vias 1444 of the present invention provide increased reliability, accuracy, and density of interconnections.

An external package 1448 is mounted above the top surface 1442 of the second encapsulation 1438. The external package 1448 having an external substrate 1450 and an external integrated circuit 1452 electrically connected to the second vias 1444 with external package interconnects 1454. Below the substrate 1402 external interconnects 1456 are mounted.

Figure 15:
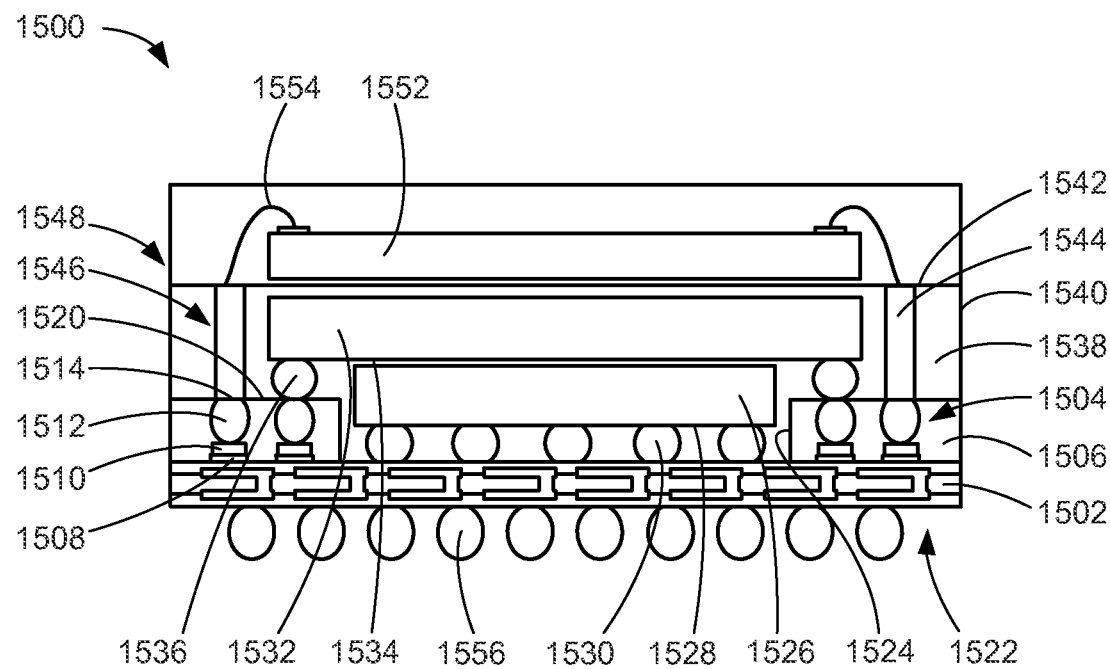
FIG. 15 is a cross-sectional view of an integrated circuit packaging system in a fourth embodiment of the present invention.

Referring now to FIG. 15, therein is shown a cross-sectional view of an integrated circuit packaging system 1500 in a fourth embodiment of the present invention. The integrated circuit packaging system 1500 is shown having a substrate 1502. The substrate 1502 is defined as a physical material on which an integrated circuit package is formed having internal conduction and isolation for signals. The substrate 1502 can be laminated plastic, ceramic, or glass.

First vias 1504 are formed above the substrate 1502 and are encapsulated with a first encapsulation 1506. The first encapsulation 1506 is defined as a structure that protects sensitive components from moisture, dust and other contamination. The first encapsulation 1506 can be glob top, film assist molding, or other encasement structures.

The first vias 1504 are defined as conductive structures formed through the first encapsulation 1506 and are depicted as having pillars 1508 over the substrate 1502 and in direct contact with the substrate 1502. The pillars 1508 are defined as an electrically conductive structure that acts to support other structures of the first vias 1504. The pillars 1508 can be copper, aluminum, gold, or other conductive materials.

A paste 1510 is formed above the pillars 1508. The paste 1510 is defined as an electrically conductive material that forms a robust electrical and mechanical connection with the pillars 1508. The paste 1510 makes a robust connection with the pillars 1508 and with spheroids 1512 affixed above the paste 1510. The spheroids 1512 can be an embedded solder balls, an electrical polymer, or other conductive materials capable of robust connection with the paste 1510. The spheroids 1512 are shown having a spherical shape with flat tops 1514. The spheroids 1512 are attached in the paste 1510 with a spherical portion of the spheroids 1512 attached in the paste 1510. The first vias 1504 are represented traversing the first encapsulation 1506 from the substrate 1502 and exposed from the first encapsulation 1506.

The flat tops 1514 of the spheroids 1512 of the first vias 1504 are depicted as coplanar with a planar surface 1520 of the first encapsulation 1506. The planar surface 1520 can extend laterally over an entire top surface of the first encapsulation 1506 and provide a stable mounting surface or connection point. The first encapsulation 1506 is formed along a perimeter region 1522 of the substrate 1502. The first vias 1504 are formed within the first encapsulation 1506 along the perimeter region 1522 of the substrate 1502. The first encapsulation 1506 is depicted having sides 1524 facing each other. The sides 1524 are defined as sides 1524 that extend vertically above the substrate 1502 and can be vertical sides, irregular shaped vertical sides, or slanted sides and are specifically depicted as flat vertical sides.

It has been discovered that the first encapsulation 1506 when utilized in combination with the substrate 1502 of the present invention provides package stacking solutions for small size logic integrated circuits with high pin count and large size memory integrated circuits with low pin count within the same package. It has further been discovered that utilizing the first vias 1504 in combination with the first encapsulation 1506 provides stacking solutions that are mechanically rigid, and low profile when used with an integrated circuit between the sides 1524 of the first encapsulation 1506.

A first integrated circuit 1526 is mounted between the sides 1524 having a first active surface 1528 facing the substrate 1502 and connected thereto with first interconnects 1530. The first integrated circuit 1526 is defined as an active component having transistor elements such as a wire-bonded die or a flip-chip die and is specifically depicted as a flip-chip integrated circuit. Active circuitry contained on the first active side 1528 is defined as including transistor elements. The first interconnects 1530 are defined as conductive structures for routing signals between elements and can be bond wires, solder balls, conductive polymers, vertical via structures and are depicted specifically as solder balls. The first integrated circuit 1526 is depicted between the sides 1524 and partially below the planar surface 1520 and partially above the planar surface 1520 of the first encapsulation 1506.

A second integrated circuit 1532 is mounted above the first integrated circuit 1526. The second integrated circuit 1532 is defined as an active component having transistor elements such as a wire-bonded die or a flip-chip die and is specifically depicted as a flip-chip integrated circuit with a second active side 1534 facing toward from the first integrated circuit 1526 and the substrate 1502. The second active side 1534 is connected and is attached to the first vias 1504 with second interconnects 1536. The second interconnects 1536 are defined as conductive structures for routing signals between elements and can be bond wires, solder balls, conductive polymers, vertical via structures and are depicted specifically as solder balls. The second integrated circuit 1532 is depicted above the sides 1524 of the first encapsulation 1506. The second integrated circuit 1532 is further depicted as above the planar surface 1520 of the first encapsulation 1506. The second integrated circuit 1532 can be mounted over the first integrated circuit 1526 with a space therebetween.

A second encapsulation 1538 is formed above the first encapsulation 1506. The second encapsulation 1538 encapsulates the first integrated circuit 1526, the first interconnects 1530, the second integrated circuit 1532, the second interconnects 1536, and the sides 1524 and the planar surface 1520 of the first encapsulation 1506. The second encapsulation 1538 is portrayed having an exterior surface 1540 that is coplanar with the first encapsulation 1506 and coplanar with the substrate 1502. The second encapsulation 1538 is further portrayed having a top surface 1542 that is flat.

Second vias 1544 traverse from the planar surface 1520 of the first encapsulation 1506 to the top surface 1542 of the second encapsulation 1538. The second vias 1544 are exposed from the second encapsulation 1538 and are coplanar with the top surface 1542. The second vias 1544 are depicted as vertical conductors filling holes 1546 in the second encapsulation 1538. The holes 1546 can be laser cut, wet etched, or dry etched and can have irregular side surfaces. The second vias 1544 can have the physical characteristics of conforming to the irregular side surfaces forming a robust mechanical connection to the second encapsulation 1538 and also forming a robust mechanical and electrical connection to the spheroids 1512 of the first vias 1504.

It has been discovered that the second vias 1544 of the present invention can provide a very fine pitch for greater density interconnections. It has been further discovered that the second vias 1544 of the present invention provide increased reliability, accuracy, and density of interconnections.

An external package 1548 is mounted above the top surface 1542 of the second encapsulation 1538 having an integrated circuit 1552 electrically connected to the second vias 1544 with external package interconnects 1554. Below the substrate 1502 external interconnects 1556 are mounted.

Figure 16:
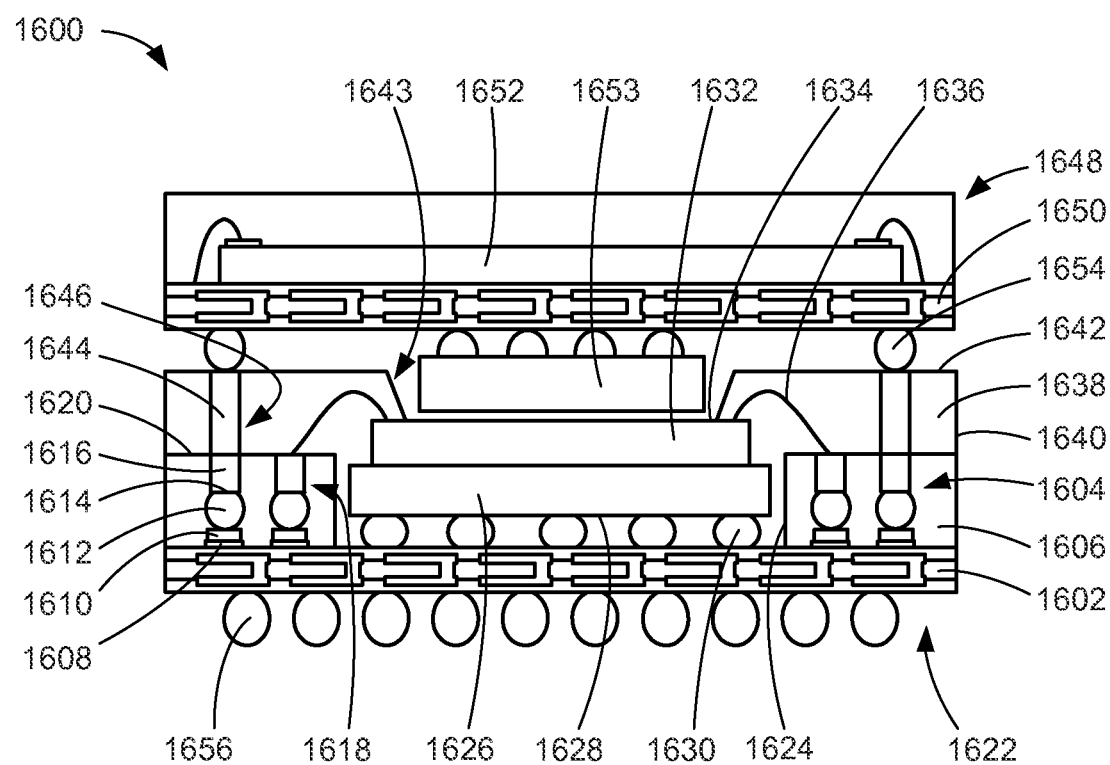
FIG. 16 is a cross-sectional view of an integrated circuit packaging system in a fifth embodiment of the present invention.

Referring now to FIG. 16, therein is shown a cross-sectional view of an integrated circuit packaging system 1600 in a fifth embodiment of the present invention. The integrated circuit packaging system 1600 is shown having a substrate 1602. The substrate 1602 is defined as a physical material on which an integrated circuit package is formed having internal conduction and isolation for signals. The substrate 1602 can be laminated plastic, ceramic, or glass.

First vias 1604 are formed above the substrate 1602 and are encapsulated with a first encapsulation 1606. The first encapsulation 1606 is defined as a structure that protects sensitive components from moisture, dust and other contamination.

The first encapsulation 1606 can be glob top, film assist molding, or other encasement structures.

The first vias 1604 are defined as conductive structures formed through the first encapsulation 1606 and are depicted as having pillars 1608 over the substrate 1602 and in direct contact with the substrate 1602. The pillars 1608 are defined as an electrically conductive structure that acts to support other structures of the first vias 1604. The pillars 1608 can be copper, aluminum, gold, or other conductive materials.

A paste 1610 is formed above the pillars 1608. The paste 1610 is defined as an electrically conductive material that forms a robust electrical and mechanical connection with the pillars 1608. The paste 1610 makes a robust connection with the pillars 1608 and with spheroids 1612 affixed above the paste 1610. The spheroids 1612 can be an embedded solder balls, an electrical polymer, or other conductive materials capable of robust connection with the paste 1610. The spheroids 1612 are shown having a spherical shape with flat tops 1614. The spheroids 1612 are attached in the paste 1610 with a spherical portion of the spheroids 1612 attached in the paste 1610.

Vertical conductors 1616 are formed above the flat tops 1614. The vertical conductors 1616 are defined as a conductive material that can fill a hole or depression, conduct electricity, conform to a surface of a depression or hole, and can form an electrical and mechanical connection. The vertical conductors 1616 are depicted filling first holes 1618 in the first encapsulation 1606. The first holes 1618 can be laser cut, wet etched, or dry etched and can have irregular side surfaces. The vertical conductors 1616 can have the physical characteristics of conforming to the irregular side surfaces and form a robust mechanical connection to the first encapsulation 1606. The first vias 1604 are represented traversing the first encapsulation 1606 from the substrate 1602 and exposed from the first encapsulation 1606.

The vertical conductors 1616 of the first vias 1604 are depicted as coplanar with a planar surface 1620 of the first encapsulation 1606. The planar surface 1620 can extend laterally over an entire top surface of the first encapsulation 1606 and provide a stable mounting surface or connection point. The first encapsulation 1606 is formed along a perimeter region 1622 of the substrate 1602. The first vias 1604 are formed within the first encapsulation 1606 along the perimeter region 1622 of the substrate 1602. The first encapsulation 1606 is depicted having sides 1624 facing each other. The sides 1624 are defined as sides 1624 that extend vertically above the substrate 1602 and can be vertical sides, irregular shaped vertical sides, or slanted sides and are specifically depicted as flat vertical sides.

It has been discovered that the first encapsulation 1606 when utilized in combination with the substrate 1602 of the present invention provides package stacking solutions for small size logic integrated circuits with high pin count and large size memory integrated circuits with low pin count within the same package. It has further been discovered that utilizing the first vias 1604 in combination with the first encapsulation 1606 of the present invention provides stacking solutions that are mechanically rigid, and low profile when used with an integrated circuit between the sides 1624 of the first encapsulation 1606.

A first integrated circuit 1626 is mounted between the sides 1624 having a first active surface 1628 facing the substrate 1602 and connected thereto with first interconnects 1630. The first integrated circuit 1626 is defined as an active component having transistor elements such as a wire-bonded die or a flip-chip die and is specifically depicted as a flip-chip integrated circuit. Active circuitry contained on the first active side 1628 is defined as including transistor elements. The first interconnects 1630 are defined as conductive structures for routing signals between elements and can be bond wires, solder balls, conductive polymers, vertical via structures and are depicted specifically as solder balls. The first integrated circuit 1626 is depicted between the sides 1624 and below the planar surface 1620 of the first encapsulation 1606.

A second integrated circuit 1632 is mounted above the first integrated circuit 1626. The second integrated circuit 1632 can be a wire-bonded integrated circuit with a second active side 1634 facing away from the first integrated circuit 1626 and the substrate 1602. The second active side 1634 is connected and is attached to the first vias 1604 with second interconnects 1636. The second interconnects 1636 can be bond wires. The second integrated circuit 1632 is depicted between the sides 1624 of the first encapsulation 1606. The second integrated circuit 1632 is further depicted as partially above the planar surface 1620 and partially below the planar surface 1620 of the first encapsulation 1606. The second integrated circuit 1632 can be mounted in direct contact to the first integrated circuit 1626 without a space therebetween.

A second encapsulation 1638 is formed above the first encapsulation 1606. The second encapsulation 1638 encapsulates the first integrated circuit 1626, the first interconnects 1630, the second integrated circuit 1632, the second interconnects 1636, and the sides 1624 and the planar surface 1620 of the first encapsulation 1606. The second encapsulation 1638 is portrayed having an exterior surface 1640 that is coplanar with the first encapsulation 1606 and coplanar with the substrate 1602. The second encapsulation 1638 is further portrayed having a top surface 1642 that is flat and having a depression 1643 that exposes the second active side 1634 of the second integrated circuit 1632 therefrom.

Second vias 1644 traverse from the planar surface 1620 of the first encapsulation 1606 to the top surface 1642 of the second encapsulation 1638. The second vias 1644 are exposed from the second encapsulation 1638 and are coplanar with the top surface 1642. The second vias 1644 are depicted as vertical conductors filling second holes 1646 in the second encapsulation 1638. The second holes 1646 can be laser cut, wet etched, or dry etched and can have irregular side surfaces. The second vias 1644 can have the physical characteristics of conforming to the irregular side surfaces forming a robust mechanical connection to the second encapsulation 1638 and also forming a robust mechanical and electrical connection to the vertical conductors 1616 of the first vias 1604.

It has been discovered that the first vias 1616 and the second vias 1644 of the present invention can provide a very fine pitch for greater density interconnections. It has been further discovered that the first vias 1616 and the second vias 1644 of the present invention provide increased reliability, accuracy, and density of interconnections.

An external package 1648 is mounted above the top surface 1642 of the second encapsulation 1638. The external package 1648 having an external substrate 1650 and a first external integrated circuit 1652 mounted above the external substrate 1650 and a second external integrated circuit 1653 mounted below the external substrate 1650 and within the depression 1643. The external package 1648 is electrically connected to the second vias 1644 with external package interconnects 1654. Below the substrate 1602 external interconnects 1656 are mounted.

Figure 17:
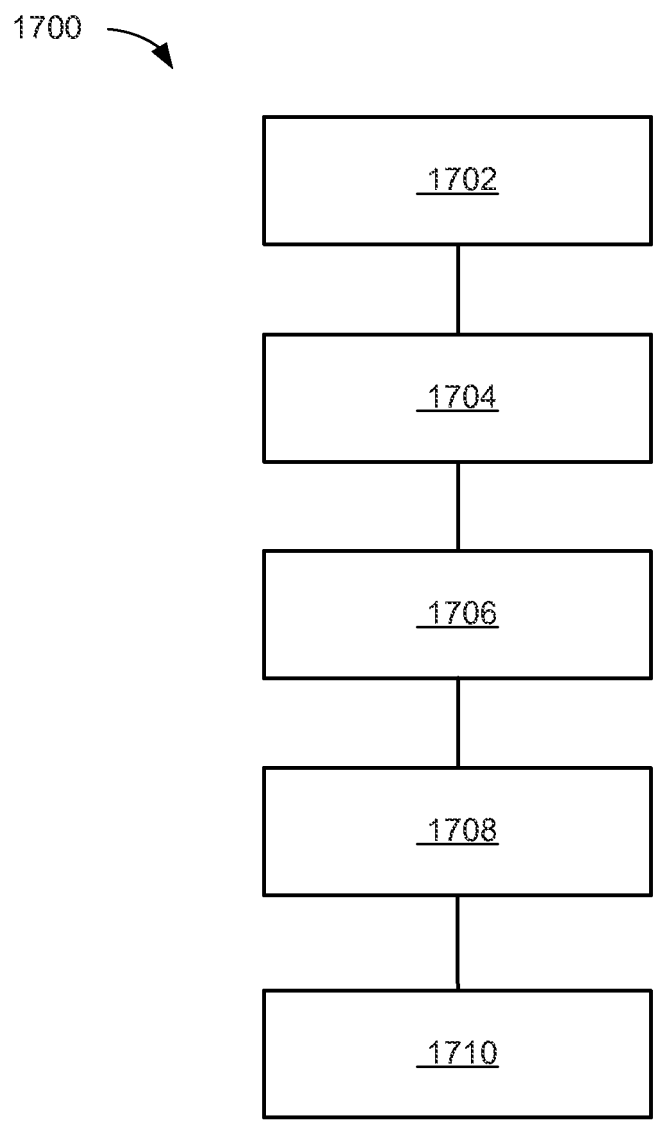
FIG. 17 is a flow chart of a method of manufacture of the integrated circuit packaging system in a further embodiment of the present invention.

Referring now to FIG. 17, therein is shown a flow chart of a method 1700 of manufacture of the integrated circuit packaging system in a further embodiment of the present invention. The method 1700 includes: providing a substrate in a block 1702; molding a first encapsulation above the substrate in a block 1704; forming a via through the first encapsulation in a block 1706; mounting an integrated circuit above the substrate and between sides of the first encapsulation in a block 1708; and forming a second encapsulation covering the integrated circuit and the first encapsulation in a block 1710.

Thus, it has been discovered that the via and encapsulation system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   molding a first encapsulation above the substrate;
   forming a via through the first encapsulation;
   mounting an integrated circuit above the substrate and between sides of the first encapsulation;
   forming a second encapsulation covering the integrated circuit and the first encapsulation; and
   connecting an external package to the substrate through the via.

2. The method as claimed in claim 1 further comprising connecting a second integrated circuit above the first integrated circuit and directly connected to the via with an interconnect.

3. The method as claimed in claim 1 wherein encapsulating the integrated circuit includes forming an exterior surface coplanar with the first encapsulation and coplanar with the substrate.

4. The method as claimed in claim 1 wherein forming the via includes forming the via coplanar with a planar surface of the first encapsulation.

5. A method of manufacture of an integrated circuit packaging system comprising:
   providing a substrate;
   molding a first encapsulation above the substrate and along a perimeter region of the substrate;
   forming a first via through the first encapsulation;
   mounting an integrated circuit between sides of the first encapsulation above the substrate and directly connected to the substrate with an interconnect;
   forming a second encapsulation covering the integrated circuit and the first encapsulation; and
   forming a second via through the second encapsulation from the first via and exposed from a top surface of the second encapsulation.

6. The method as claimed in claim 5 wherein forming the first via includes forming the first via having a pillar, a paste, and a spheroid.

7. The method as claimed in claim 5 wherein forming the first via includes forming the first via having a vertical conductor.

8. The method as claimed in claim 5 wherein encapsulating the integrated circuit includes forming the top surface having a depression.

9. The method as claimed in claim 5 wherein forming the second via includes forming the second via coplanar with the top surface of the second encapsulation.

10. An integrated circuit packaging system comprising:
    a substrate;
    a first encapsulation molded above the substrate, wherein the first encapsulation is formed along a perimeter region of the substrate;
    a first via formed through the first encapsulation;
    an integrated circuit mounted above the substrate and between sides of the first encapsulation, wherein the integrated circuit is directly connected to the substrate with an interconnect;
    a second encapsulation covering the integrated circuit and the first encapsulation; and
    a second via formed through the second encapsulation from the first via and exposed from a top surface of the second encapsulation.

11. The system as claimed in claim 10 further comprising a second integrated circuit mounted above the first integrated circuit and directly connected to the via with an interconnect.

12. The system as claimed in claim 10 further comprising an external package connected to the substrate through the via.

13. The system as claimed in claim 10 further comprising an exterior surface of the second encapsulation coplanar with the first encapsulation and coplanar with the substrate.

14. The system as claimed in claim 10 wherein the via is formed coplanar with a planar surface of the first encapsulation.

15. The system as claimed in claim 10 wherein the first via has a pillar, a paste, and a spheroid.

16. The system as claimed in claim 10 wherein the first via has a vertical conductor.

17. The system as claimed in claim 10 wherein the top surface has a depression.

18. The system as claimed in claim 10 wherein the second via is formed coplanar with the top surface of the second encapsulation.

* * * * *